United States Patent
Chambers et al.

(10) Patent No.: US 10,463,119 B1
(45) Date of Patent: Nov. 5, 2019

(54) BAND WITH MAGNETIC CLOSURE MECHANISM

(71) Applicant: Apple Inc., Cupertino, CA (US)

(72) Inventors: Trevor S. Chambers, Cupertino, CA (US); Hao Zhu, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 144 days.

(21) Appl. No.: 15/249,852

(22) Filed: Aug. 29, 2016

Related U.S. Application Data

(60) Provisional application No. 62/234,845, filed on Sep. 30, 2015.

(51) Int. Cl.
| | | |
|---|---|---|
| *A44C 5/20* | (2006.01) | |
| *A44C 5/24* | (2006.01) | |
| *H05K 5/02* | (2006.01) | |
| *H05K 5/00* | (2006.01) | |
| *H01F 7/02* | (2006.01) | |
| *G06F 1/16* | (2006.01) | |

(52) U.S. Cl.
CPC ............ *A44C 5/2071* (2013.01); *A44C 5/246* (2013.01); *G06F 1/163* (2013.01); *H01F 7/021* (2013.01); *H05K 5/0086* (2013.01); *H05K 5/0217* (2013.01)

(58) Field of Classification Search
CPC ....... A44C 5/2071; A44C 5/246; H01F 7/021; H05K 5/0086; H05K 5/0217; G06F 1/163; Y10T 24/4782; Y10T 24/32
See application file for complete search history.

(56) References Cited

U.S. PATENT DOCUMENTS

| | | | | |
|---|---|---|---|---|
| 5,829,104 | A * | 11/1998 | Gay ........................ | A44C 5/24 24/71 J |
| 7,363,687 | B2 * | 4/2008 | Kraus ...................... | A44C 5/14 24/303 |
| 8,789,245 | B2 * | 7/2014 | Leger ..................... | A44C 5/246 24/265 WS |
| 10,149,518 | B1 * | 12/2018 | de Iuliis ............... | A44C 5/0007 |
| 2009/0289090 | A1 * | 11/2009 | Fullerton ................. | A45F 5/02 224/183 |
| 2013/0271250 | A1 * | 10/2013 | Weissleder .............. | H01F 1/009 335/306 |
| 2013/0326790 | A1 * | 12/2013 | Cauwels .............. | A44C 5/2071 2/170 |
| 2014/0000312 | A1 * | 1/2014 | Nicolas .................... | A44C 5/04 63/3.2 |

* cited by examiner

*Primary Examiner* — Robert Sandy
*Assistant Examiner* — Rowland Do
(74) *Attorney, Agent, or Firm* — Morgan, Lewis & Bockius LLP

(57) ABSTRACT

A band for a wearable device includes a first strap having a magnetic insert defining an array of holes, and a second strap having a magnetic protrusion configured to be at least partially disposed in a respective hole of the array of holes and to magnetically couple to the magnetic insert. A method of manufacturing a magnetic strap for a wearable device includes disposing a magnetizable insert between a first layer and a second layer, and coupling the first layer to the second layer such that the magnetizable insert is retained between the first layer and the second layer. The magnetizable insert includes a magnetizable material suspended in a polymer.

19 Claims, 11 Drawing Sheets

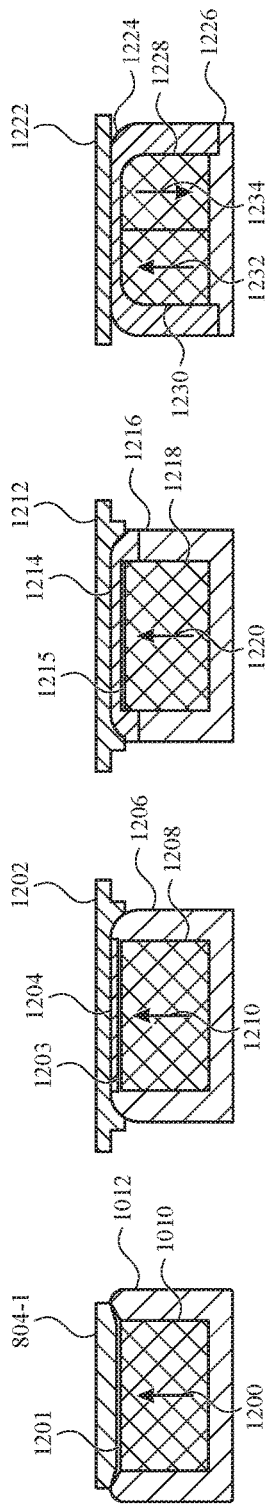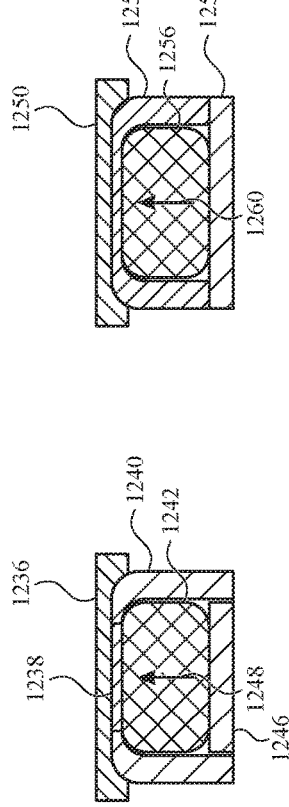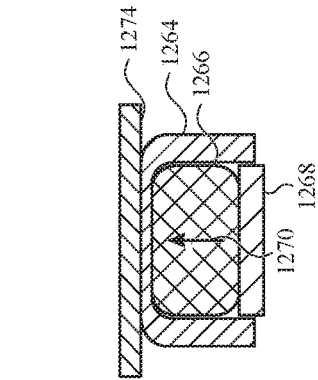

BAND WITH MAGNETIC CLOSURE MECHANISM

CROSS-REFERENCE TO RELATED APPLICATION(S)

This application is a nonprovisional patent application of U.S. Provisional Patent Application No. 62/234,845, filed Sep. 30, 2015 and titled "Band with Magnetic Closure Mechanism," the disclosure of which is hereby incorporated herein by reference in its entirety.

FIELD

The disclosure relates generally to wearable electronic devices, and more particularly to bands that are used to secure devices to persons or objects.

BACKGROUND

Conventional wearable devices, such as wristwatches, include bands that couple the device to a user. For example, a conventional wristwatch typically includes a band that attaches the watch to a user's wrist. Bands may be formed from various materials, such as fabric, leather, links, and the like. In order for bands to be applied to and removed from a user, bands may use clasps, buckles, or other closure mechanisms that allow the band to expand or open so that a user can apply the device to a desired body part or object, and also secure the band together (at a smaller size) to retain the device to the wearer.

SUMMARY

A band for a wearable device includes a first strap comprising a magnetic insert defining an array of holes, and a second strap comprising a magnetic protrusion configured to be at least partially disposed in a respective hole of the array of holes and to magnetically couple to the magnetic insert. The magnetic insert may include a polymer material having magnetized particles suspended therein, and the magnetic protrusion may include a permanent magnet.

The first strap may further include a first layer defining a first exterior surface and a second layer defining a second exterior surface opposite the first exterior surface. The magnetic insert may be between the first layer and the second layer.

The band may further include a clasp coupled to the second strap and comprising a first clasp portion pivotally coupled to a second clasp portion. The magnetic protrusion may extend from a surface of the second clasp portion. In a closed configuration, the first strap may be captured between the first clasp portion and the second clasp portion such that the magnetic protrusion is retained at least partially in the respective hole. The clasp may include latching features that releasably retain the clasp in the closed configuration.

The first strap may extend along a longitudinal axis, and the magnetic insert may have a magnetic pole orientation that is substantially parallel to the longitudinal axis.

A band for a wearable device may include a first strap defining a blind hole, a ferromagnetic plate disposed in the blind hole, and a second strap comprising a magnetic engagement feature configured to be at least partially disposed in the blind hole and magnetically coupled to the ferromagnetic plate. The magnetic engagement feature may include a magnet and an encasing structure surrounding at least part of the magnet. The encasing structure may be configured to engage the ferromagnetic plate when the magnetic engagement feature is disposed at least partially in the blind hole.

The first strap may extend along a longitudinal axis, and the magnetic engagement feature may be magnetically attracted to the ferromagnetic plate along an attraction axis that is perpendicular to the longitudinal axis. The band may further include a clasp coupled to the second strap and comprising a first clasp portion pivotally coupled to a second clasp portion. The magnetic engagement feature may extend from a surface of the second clasp portion. In a closed configuration, the first strap may be captured between the first clasp portion and the second clasp portion such that the magnetic engagement feature is retained at least partially in the blind hole.

The encasing structure may define an opening, and the ferromagnetic plate may be configured to be at least partially disposed in the opening when the magnetic engagement feature is disposed at least partially in the blind hole. The ferromagnetic plate may define a concave surface, and the encasing structure may define a convex surface configured to contact the concave surface when the magnetic engagement feature is disposed at least partially in the blind hole. The encasing structure may include a first component formed from a magnetic material, and a second component formed from a non-magnetic material. The non-magnetic material may be disposed over a top of the magnet such that the non-magnetic material is between the magnet and the ferromagnetic plate when the magnetic engagement feature is disposed at least partially in the blind hole.

The magnet may be a first magnet having a first magnetic pole orientation, and the magnetic engagement feature may further include a second magnet having a second magnetic pole orientation opposite the first magnetic pole orientation. The ferromagnetic plate may define a coupling face. When the magnetic engagement feature is disposed at least partially in the blind hole, the first and second magnetic pole orientations may be substantially perpendicular to the coupling face.

A method of manufacturing a magnetic strap for a wearable device includes disposing a magnetizable insert between a first layer and a second layer and coupling the first layer to the second layer such that the magnetizable insert is retained between the first layer and the second layer. The magnetizable insert may include a magnetizable material suspended in a polymer material.

The method may further include magnetizing the magnetizable insert such that a magnetic pole orientation of the magnetizable insert is substantially parallel to a longitudinal axis of the magnetic strap. The operation of magnetizing the magnetizable insert may be performed after the operation of coupling the first layer to the second layer.

The method may further include forming an array of holes through the second layer and the magnetizable insert. The operation of forming the array of holes may include forming the array of holes through the first layer, the magnetizable material, and the second layer.

The method may further include mixing the magnetizable material with the polymer material to form a moldable mixture, introducing the moldable mixture into a mold cavity, and curing the moldable mixture to form the magnetizable insert.

BRIEF DESCRIPTION OF THE DRAWINGS

The disclosure will be readily understood by the following detailed description in conjunction with the accompanying drawings, wherein like reference numerals designate like structural elements.

FIGS. 12A-12I show cross-sectional views of a magnetic engagement feature.

DETAILED DESCRIPTION

Figure 1:
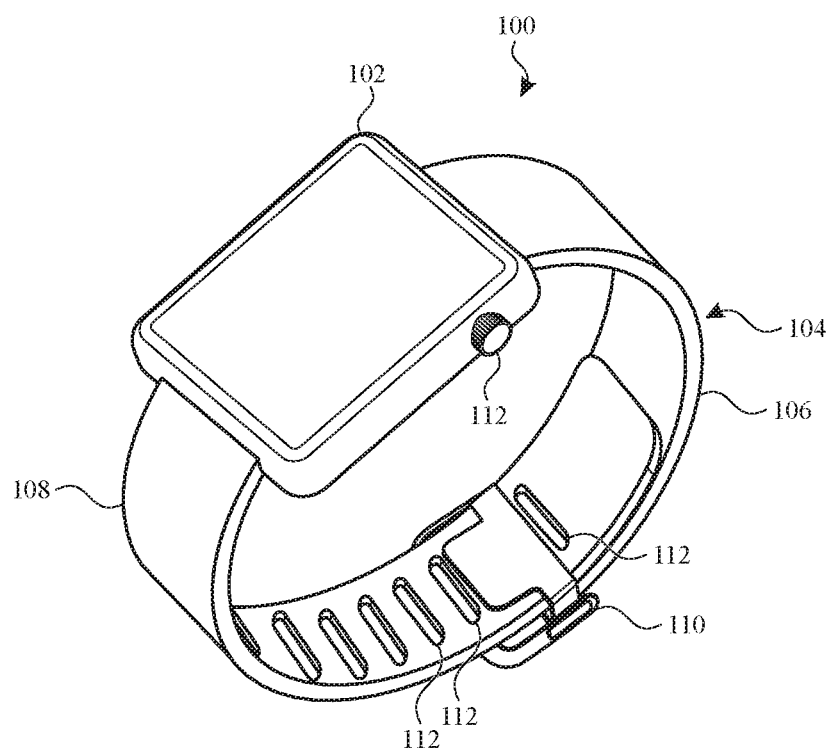
FIG. 1 shows an example wearable device including a band.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Wearable devices, such as watches, are typically secured to a user or to an object with a band. Some bands are composed of multiple rigid links that can articulate with respect to one another to allow the band to flex to conform to a wearer's wrist. Other bands use materials that are inherently flexible, such as fabrics, leather, polymers, or the like. Discussed herein are bands for wearable devices that use magnets and/or magnetic materials to facilitate secure coupling of the band. For example, a flexible magnetic insert with a series of holes may be incorporated in one strap of a band, and a magnetic post may be incorporated on another strap (e.g., on a clasp). The magnetic post may be magnetically attracted to the magnetic insert when the post is inserted into one of the holes in order to help retain the two straps together and to provide tactile feedback to the user indicating that the straps have been securely coupled. The mechanical engagement of the post and the hole in which the post is inserted may provide the retention force that keeps the two straps coupled together when the band is being worn.

The flexible magnetic insert can be incorporated into straps made of various different materials, and can be formed into many different shapes and configurations. Moreover, the flexible magnetic insert may be magnetized so that a magnetic pole orientation (e.g., a vector extending generally from a south pole of a magnet to a north pole of the magnet) is parallel with the length of the strap. The magnetic post may have a magnetic pole orientation that is parallel with (and facing the same direction as) the flexible magnetic insert so that the direction of the magnetic flux through the post and the insert is directed along the length the strap, rather than perpendicular to the length of the strap.

Also discussed herein are bands having ferromagnetic inserts (e.g., steel disks or plates) disposed within each of a series of holes along the length of a strap, and a magnetic engagement feature that is magnetically attracted to the inserts when the post is inserted into one of the holes. The magnetic attraction helps retain the two straps together and provides tactile feedback to the user that the straps have been securely coupled. The magnetic engagement features may include structures and/or materials that may increase the magnetic attraction between the engagement feature and the insert, and may focus, shunt, concentrate, or otherwise change the magnetic field produced by a magnet of the magnetic engagement feature.

In the following figures and description, similar instances of particular components or features may be designated by additional indicators appended to the element number. For example, a particular instance of a hole 112 may be designated 112-1. References to an element number without any additional indicator (e.g., the hole 112) apply to any or all instances of that component or feature, and references to an element number with an additional indicator (e.g., the hole 112-1) apply to a particular instance of that component or feature. Moreover, any discussion related to an individual instance of a component or feature (e.g., the hole 112-1) may also apply to other instances of that component. Also, while the components and concepts are described herein with reference to wearable electronic devices, it will be understood that this is merely an example, and the components and concepts may apply equally to other objects as well, such as belts, backpack straps, tie-downs, lanyards, and the like.

FIG. 1 shows a wearable device 100 (also referred to as "device 100"). The device 100 may be any appropriate wearable device, including an electrical or mechanical wrist watch, an electronic computing device, a health monitoring device, a timekeeping device, a stopwatch, etc. The device 100 may include a housing 102 that forms an outer surface or partial outer surface and protective case for the internal components of the device 100. The housing 102 may also include mounting features formed on opposite ends to connect a wearable band 104 (also referred to as "band 104") to the housing 102. The band 104 may include a first strap 108, a second strap 106, and a clasp 110 for releasably coupling the first strap 108 to the second strap 106. The first strap 108 defines an array of holes 112 into which a protrusion on the clasp 110 may extend in order to secure the first strap 108 to the second strap 106. Each of the holes 112 corresponds to a different size of the band 104, allowing a wearer to select a desired band tightness.

The first strap 108 and the second strap 106 may be separate components (as shown in FIG. 1) or they may be a single component. For example, a single length of material may pass through the housing 102 and/or through loops or other mounting structures of the housing 102 to form two distinct segments extending from opposite sides of the housing 102 (e.g., segments analogous to the first strap 108 and the second strap 106).

Figure 2:
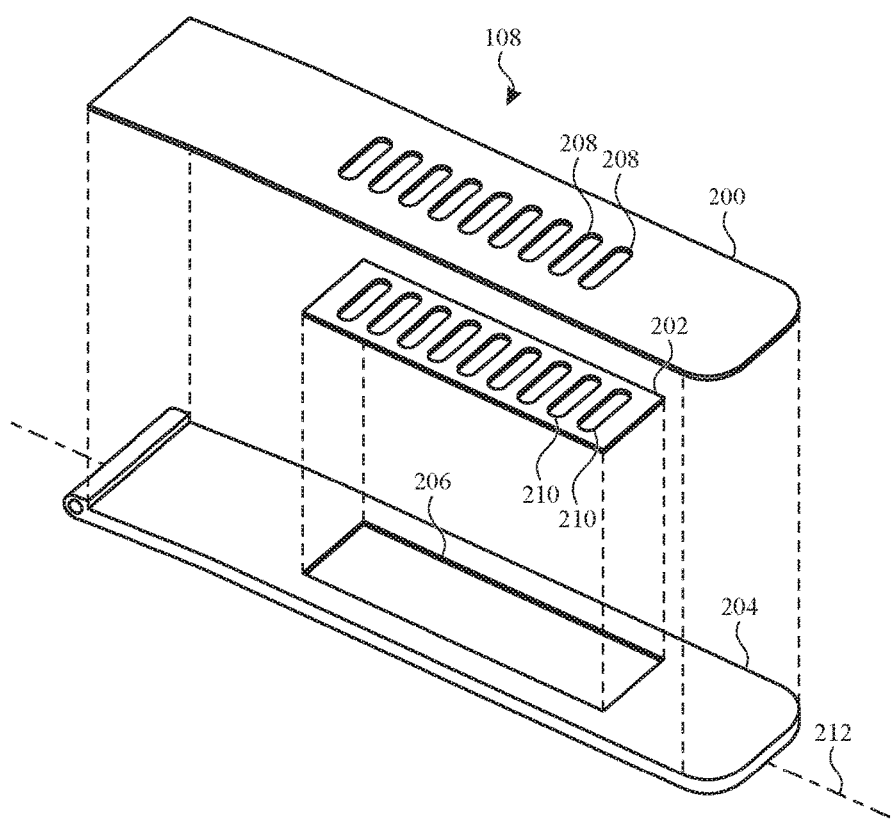
FIG. 2 shows an exploded view of a strap for the band of FIG. 1.

FIG. 2 is an exploded view of the first strap 108. The first strap 108 comprises a first layer 200 and a second layer 204. The first layer 200 defines a first exterior surface of the first strap 108, and the second layer 204 defines a second exterior surface of the first strap 108 that is opposite the first exterior surface. For example, the first layer 200 may define an exterior surface that sits against or proximate a wearer's body when the device 100 is attached to the wearer, and the second layer 204 may define an exterior surface that faces away from the wearer's body when the device 100 is attached to the wearer.

The first and second layers 200, 204 (as well as the second strap 106) may be formed from or include any appropriate material. For example, either or both of the first and second layers 200, 204 may be formed from or include leather, polymer (e.g., silicone, nylon, polyurethane, liquid crystal polymer (e.g., Vectran), para-aramid (e.g., Kevlar), or the like), fabric, and so forth. The first and second layers 200, 204 may be formed from the same or different materials. The first strap 108 may also include other layers or components that are not shown in FIG. 2. For example, the first strap 108 may include reinforcing layers, adhesive layers, stitching, seams, and the like.

The first strap 108 also includes a flexible magnetic insert 202 (also referred to herein as "magnetic insert 202"). The flexibility of the magnetic insert 202 allows the band to use magnetic attraction to facilitate coupling of the first and second straps 108, 106, while also allowing the straps to easily flex and conform to a wearer's body (or other object). The flexibility also permits the magnetic insert 202 to be formed into shapes and sizes that may not be feasible with rigid magnets, and allows the magnetic insert 202 to be coupled to other strap components and/or materials more easily than may be possible with rigid magnets.

The magnetic insert 202 may be disposed in a recess 206 in the second layer 204, and the first layer 200 may then be disposed over the second layer 204 and over the magnetic insert 202 such that the magnetic insert 202 is disposed between the first and second layers 200, 204. The magnetic insert 202 may be coupled to the second layer 204 and/or the first layer 200 with an adhesive or other bonding agent. Alternatively, the magnetic insert 202 may be held in place without being adhered to the first or second layers 200, 204. For example, the first layer 200 may be sewn, glued, molded, ultrasonic welded, or otherwise securely coupled to the second layer 204, and the magnetic insert 202 may be held between the layers as a result of the coupling between the layers.

Figure 5:
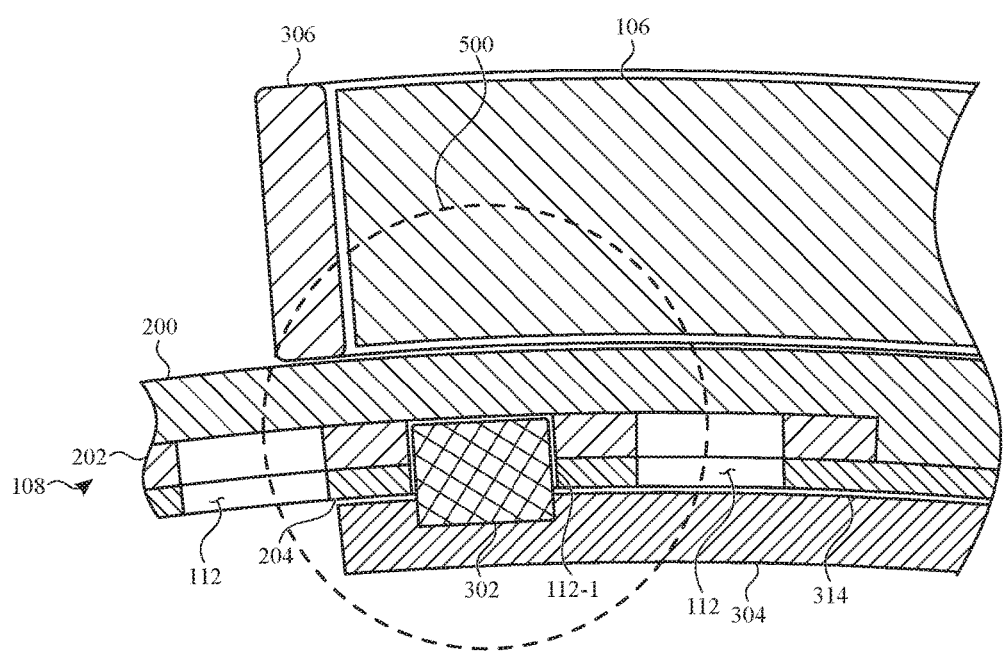
FIG. 5 shows a cross-sectional view of the band of FIG. 1 viewed along line 5-5 in FIG. 4.

The first layer 200 may define an array of holes 208 therein. The holes 208 in the first layer 200 may be configured to align with holes 210 in the magnetic insert 202. The holes 208 in the first layer 200 and the holes 210 in the magnetic insert 202 together form the holes 112 of the first strap 108 into which a magnetic protrusion extends (as shown in FIG. 5, for example). As shown, the holes 208, 210 extend all the way through the first layer 200 and the magnetic insert 202, respectively. However, in some cases, the holes in either or both the first layer 200 and the magnetic insert 202 may be blind holes. Moreover, while not shown in FIG. 2, the second layer 204 may include through-holes that align with the holes 208, 210, thereby forming holes that extend through the whole thickness of the first strap 108.

The flexible magnetic insert 202 may be magnetized so that it produces a persistent magnetic field. The magnetic field may have a magnetic pole orientation that is parallel to a longitudinal axis 212 of the first strap 108. (The longitudinal axis 212 of the first strap 108 extends along the first strap 108 from an end that is coupled to the housing 102 to an end that is configured to couple to the clasp 110.) For example, a north pole of the flexible magnetic insert 202 may be located at an end of the magnetic insert 202 that is proximate the housing 102, and the south pole may be located at an opposite end of the magnetic insert 202. The relative positions of the north and south poles of the magnetic insert 202 may also be swapped from that described above. In either case, a line extending from one pole of the magnetic insert 202 to the other pole may be substantially parallel with the longitudinal axis 212 of the first strap 108.

The flexible magnetic insert 202 may be formed from and/or include any appropriate materials. For example, the magnetic insert 202 may comprise a flexible matrix (e.g., a polymer such as silicone, nylon, polyurethane, or any other appropriate material) with magnetized particles suspended therein. The magnetized particles may be particles of neodymium iron boron, samarium cobalt, alnico, ceramic, or the like. The magnetized particles may be magnetized before or after being suspended in the flexible material. For example, unmagnetized particles of a magnetic material may be incorporated in a polymer material, and then the polymer material with the unmagnetized particles may thereafter be molded or otherwise processed to form an unmagnetized flexible insert. The unmagnetized flexible insert is then exposed to a magnetic field, thereby magnetizing the particles and producing a magnetic insert that produces a persistent magnetic field. Alternatively, magnetized particles may be introduced into the polymer material prior to molding or forming the magnetic insert 202. The magnetic pole orientations of the magnetic particles may be aligned in a common direction, for example, by exposing the polymer material to a magnetic field during the molding or forming process.

The first strap 108 may include components or structures that surround all or parts of the walls and edges that define the holes 112. For example, the edges and/or walls that define the holes 112 may be covered with a sealing material, such as a polymer material that may be sprayed-on, brushed-on, or otherwise applied to the first strap 108. As another example, an eyelet or grommet structure may be disposed in the holes 112 and/or around the edges that define the openings of the holes 112. As yet another example, the edges and/or walls that define the holes 112 may be stitched. As yet another example, the magnetic insert 202 may be coated with a second material that encapsulates the magnetic insert 202 and forms the rest of the first strap 108. The second material may be sprayed, overmolded, dip-coated, shrink-wrapped, or the like. Such components or seals may help strengthen the holes 112, prevent delamination of the components of the first strap 108, and/or seal the magnetic insert 202 so that the magnetic particles (which may be partially exposed along the sidewalls of the holes 210) do not contact or damage other components of the band 104.

While FIG. 2 illustrates an assembly that includes three components, this is merely exemplary, and the first strap 108 may include or be formed from more or fewer components. Moreover, the first strap 108 and the magnetic insert 202 may not be assembled as shown or implied in FIG. 2. For example, the first strap 108 may be a single, monolithic polymer structure having magnetic particles suspended throughout the first strap 108. As another example, the first strap 108 may be a single, monolithic polymer structure having magnetic particles suspended only in (or concentrated most heavily in) certain positions, such as the areas proximate the holes 210. As yet another example, the magnetic insert 202 may have a core of reinforcing material, and a polymer having magnetic particles suspended therein may encapsulate the core. The polymer material with the magnetic particles may be sprayed, overmolded, dip-coated, or otherwise applied to the core in order to form the magnetic insert 202.

Figure 3:
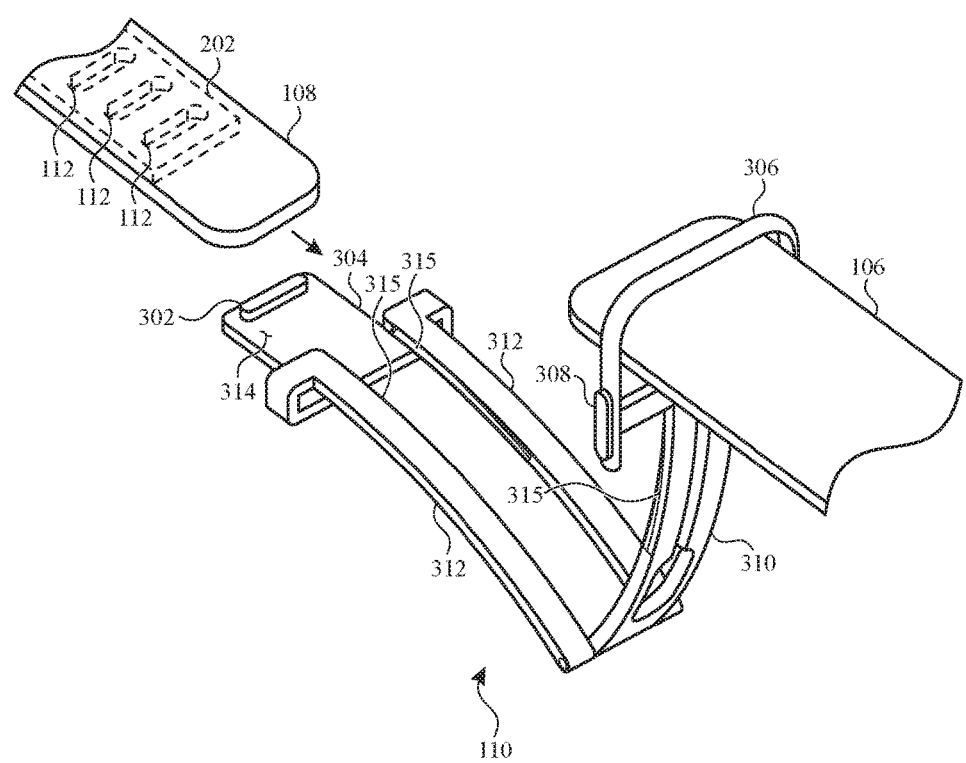
FIG. 3 shows a partial view of the band of FIG. 1.
Figure 4:
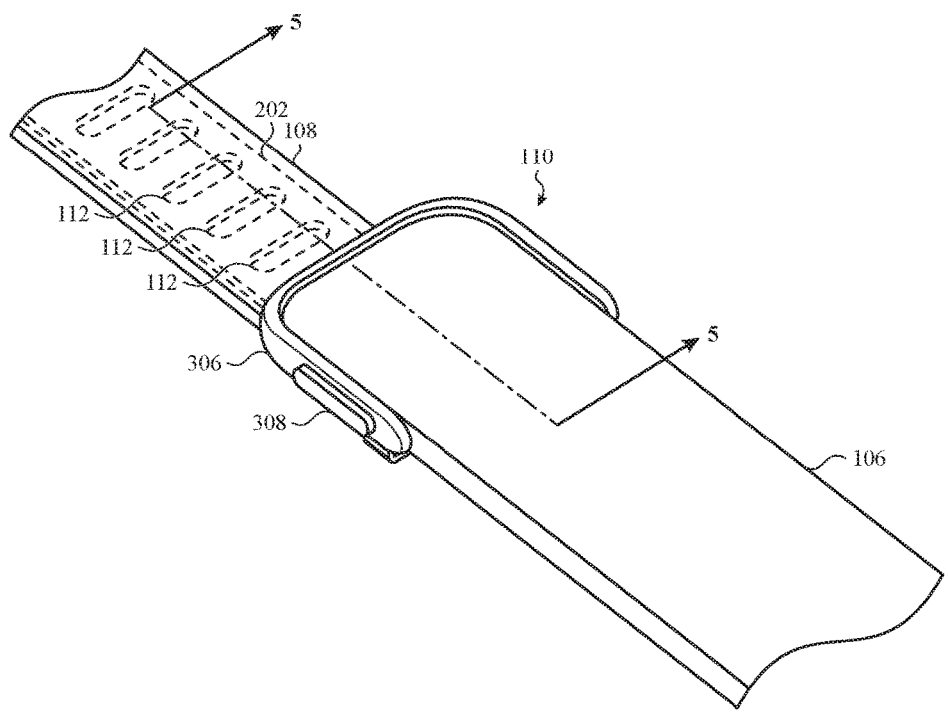
FIG. 4 shows a partial view of the band of FIG. 1.

As noted above, bands for watches and other wearable devices may have clasps that allow the user to open and close the band to facilitate application and removal of the device from the user's wrist. FIG. 3 illustrates a partial view of the band 104, showing the first and second straps 108, 106 in an uncoupled configuration with the clasp 110 in an open configuration. FIG. 4 illustrates a partial view of the band 104 showing the first and second straps 108, 106 coupled together via the clasp 110, which is in a closed configuration.

The clasp 110 includes a strap connection portion 306 that is pivotally coupled to the second strap 106. The strap connection portion 306 is also coupled to a pair of spring arms 310. The spring arms 310 include and/or are otherwise connected to buttons 308 that are accessible from the sides of the strap connection portion 306 and which facilitate unlatching of the clasp 110 to open the clasp 110 from a closed configuration (FIG. 4). The spring arms 310 are pivotally coupled to a base portion 304 of the clasp 110.

The base portion 304 includes a magnetic protrusion 302 extending from a surface 314 of the base portion 304. The magnetic protrusion 302 may be a permanent magnet of any appropriate material, such as neodymium iron boron, samarium cobalt, alnico, ceramic, or the like. The magnetic protrusion 302 is configured to be disposed in one of the holes 112 and to magnetically couple to the magnetic insert 202 of the first strap 108. As shown, the clasp 110 includes one magnetic protrusion 302, but more may be used (e.g., two, three, four, or more magnetic protrusions may be disposed on the clasp 110, set apart from one another by the same distance as the holes 112). Moreover, the base portion 304 of the clasp 110 may also be magnetic.

In embodiments where the holes 112 are through-holes extending through the whole thickness of the first strap 108, the clasp 110 may include a second magnetic protrusion (not shown) extending away from the strap connection portion 306 and configured to be disposed in the same hole 112 as the magnetic protrusion 302. The second magnetic protrusion may magnetically and mechanically couple to the magnetic insert 202 in the same or similar manner as the magnetic protrusion 302, and may also magnetically couple to the magnetic protrusion 302.

The holes 112 and the magnetic protrusion 302 may also include undercuts, recesses, angled surfaces, or other features that are configured to mechanically engage with one another to prevent the first and second straps 108, 106 from separating from one another. For example, the holes 112 may include undercuts near the interior ends of the holes, and the magnetic protrusion 302 may have a feature that is configured to be disposed in the undercuts. When the magnetic protrusion 302 is disposed in a given hole 112, the feature may be disposed in and engaged with the undercut. Moreover, the undercut and the feature may be configured so that a separation or expansion force on the band (e.g., as may be caused during normal use of the band) tends to further force the feature to engage with the undercut, thereby increasing the strength and security of the mechanical engagement between the magnetic protrusion 302 and the first strap 108.

The spring arms 310 of the clasp 110 are configured to couple to arms 312 of the base portion 304 to retain the clasp 110 in a closed configuration (shown in FIG. 4). In particular, the spring arms 310 and the arms 312 may include latching features 315 that engage with one another to retain the spring arms 310 to the arms 312. The latching features 315 may be configured such that pressing on the buttons 308 when the clasp 110 is in the closed configuration causes the latching features 315 to disengage sufficiently that a wearer can pivot the spring arms 310 out of engagement with the arms 312 and thus open the clasp 110.

FIG. 5 is a partial cross-sectional view of the band 104, taken through line 5-5 in FIG. 4. As shown in FIG. 5, the magnetic protrusion 302, which is coupled to the base portion 304 of the clasp 110, is disposed in a hole 112-1. The magnetic protrusion 302 extends through the second layer 204 and into the magnetic insert 202, thereby mechanically retaining the second strap 106 to the first strap 108. In particular, the mechanical engagement between the magnetic protrusion 302 and the first strap 108 prevents the first and second straps 108, 106 from sliding with respect to one another, and thus ensures that the band 104 remains at the size selected by a wearer. Moreover, as discussed herein, the placement of the magnetic protrusion 302 within the hole 112-1 of the magnetic insert 202 also results in a magnetic attraction between the magnetic protrusion 302 and the magnetic insert 202 that helps retain the first and second straps 108, 106 together, and also provides a positive tactile feedback to a user indicating that the magnetic protrusion 302 has positively engaged the first strap 108.

In addition to the magnetic attraction between the magnetic protrusion 302 and the magnetic insert 202, when the clasp 110 is in the closed configuration, the first strap 108 is captured between the surface 314 and the strap connection portion 306 such that the magnetic protrusion 302 is retained in the hole 112-1. In particular, when the clasp 110 is in the closed configuration, the space between the strap connection portion 306 and the surface 314 is such that the first strap 108 cannot be lifted off from the magnetic protrusion 302. For example, the distance between the strap connection portion 306 and the surface 314 may be approximately the same as the thickness of the first strap 108 in the area where the first strap 108 is designed to be inserted into the clasp 110. In some cases, the distance between the strap connection portion 306 and the surface 314 may be less than the thickness of the first strap 108. In such cases, the first strap 108 may be slightly compressed between the strap connection portion 306 and the surface 314, thereby securely coupling the first and second strap 108, 106 as well as reducing or eliminating gaps and clearances that might result in play or an otherwise loose coupling.

Figure 6:
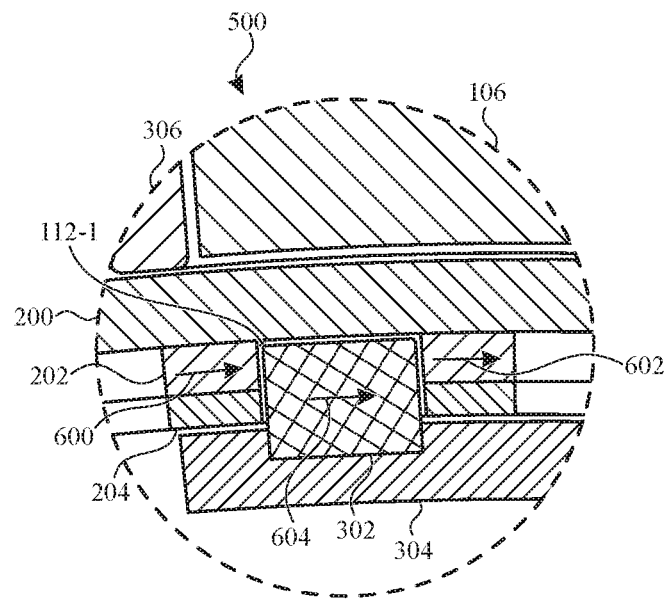
FIG. 6 shows a detail cross-sectional view of a portion of the band of FIG. 5.

FIG. 6 is a detail view of the area 500 in FIG. 5, showing the magnetic protrusion 302 disposed in the hole 112-1. The arrows 600, 602, and 604 illustrate the magnetic pole orientations of the magnetic insert 202 and the magnetic protrusion 302. In particular, as noted above, the magnetic pole orientation of the magnetic insert 202, shown by arrows 600 and 602, is substantially parallel with the longitudinal axis 212 (FIG. 2) of the first strap 108. Similarly, the magnetic pole orientation of the magnetic protrusion 302 (when the protrusion is disposed in the hole 112-1) is substantially parallel with the longitudinal axis 212 of the first strap 108, and faces the same direction as the magnetic pole orientation of the magnetic insert 202. (The arrows 600, 602, and 604 may also correspond to a magnetic flux field line of the magnetic fields produced by the magnetic insert 202 and the magnetic protrusion 302.)

When the magnetic protrusion 302 is brought into proximity of the hole 112-1, the magnetic protrusion 302 is subject to an attraction that tends to bring the magnetic field of the magnetic insert 202 into alignment with (e.g., in line with) the magnetic field of the magnetic protrusion 302. The tendency of these magnetic fields to align with one another results in a force that tends to draw the magnetic protrusion 302 into the hole 112-1 of the magnetic insert 202. Thus, while the direction of the magnetic flux through the magnetic insert 202 and the magnetic protrusion 302 is substantially parallel to the longitudinal axis 212 of the first strap 108, a resulting attraction force is perpendicular to the longitudinal axis 212 (as shown by arrow 700 in FIG. 7).

Figure 7:
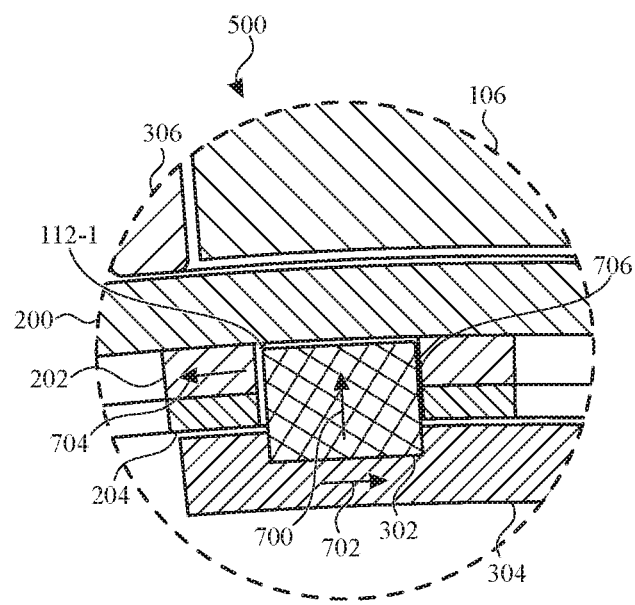
FIG. 7 shows a detail cross-sectional view of a portion of the band of FIG. 5.

FIG. 7 is another detail view of the area 500 in FIG. 5, illustrating forces that may be present in the band 104 during use. For example, arrows 702 and 704 illustrate the forces that may be applied to the second strap 106 and the first strap 108, respectively, when the band 104 is being worn (e.g., a separation or expansion force). As a result of the separation forces, a side of the magnetic protrusion 302 engages with a side of the hole 112-1 (e.g., at interface 706). This mechanical engagement prevents the first and second straps 108, 106 from separating and allowing the band 104 to open or loosen. Arrow 700, on the other hand, represents the force produced by the interaction between the magnetic fields of the magnetic insert 202 and the magnetic protrusion 302 that tends to draw (and retain) the magnetic protrusion 302 in the hole 112-1 (also referred to as an attraction axis).

Figure 8:
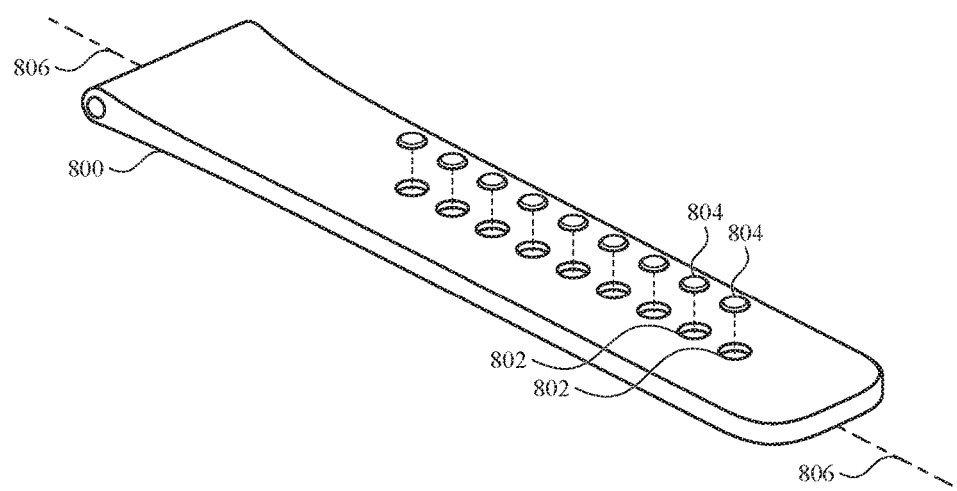
FIG. 8 shows a strap for a band for a wearable device.

FIG. 8 is an exploded view of a first strap 800. The first strap 800 is similar to the first strap 108, but instead of (or in addition to) a flexible magnetic insert, the first strap 800 defines an array of holes 802 each having a ferromagnetic insert 804 disposed therein.

The first strap 800 may be formed from or include any appropriate material(s), such as leather, fabric, polymers, and so forth. The first strap 800 may comprise a monolithic component, such as a molded polymer material, or it may comprise multiple components, such as multiple layers of material that are stitched, adhered, bonded, or otherwise coupled together.

The ferromagnetic inserts 804 may be magnets formed from or including any appropriate material, such as iron, nickel, cobalt, and/or alloys thereof. The ferromagnetic inserts 804 may be coupled to the first strap 800 within the holes 802 (e.g., on the bottom surface of the blind holes) by any appropriate mechanism. For example, the ferromagnetic inserts 804 may be glued or otherwise bonded to the first strap 800, and/or coupled via mechanical means (e.g., the first strap 800 may define or include undercuts or other retention features in the holes 802 that mechanically engage with the ferromagnetic inserts 804). The ferromagnetic inserts 804 are configured to magnetically couple to a magnetic engagement feature 908 of a clasp 906 (FIG. 9).

The ferromagnetic inserts 804 may have any suitable shape and size. For example, the ferromagnetic inserts 804 may be disk- or plate-shaped pieces of ferromagnetic material. More particularly, the ferromagnetic inserts 804 may be substantially flat (with or without contoured surfaces, as described herein), and may be circular, oblong, square, octagonal, or any other suitable shape.

The holes 802 may be blind holes, and the ferromagnetic inserts 804 may be coupled to the blind end (e.g., the bottom) of the blind holes 802. In embodiments where the holes 802 are blind holes, a surface of the first strap 800 may be substantially continuous or unbroken. By contrast, through holes would leave an opening in a surface of the first strap 800, which may reduce the security and durability of the strap. For example, openings on an exterior surface of the first strap 800 may catch and/or retain foreign objects or particles, which could lead to unintended opening or detachment of a band. Moreover, the ferromagnetic inserts 804 may be supported by or on the bottom surface of the blind holes. This also positions the ferromagnetic inserts 804 above a magnetic engagement feature of a clasp (e.g., the magnetic engagement feature 904, FIG. 9), thus orienting the ferromagnetic inserts 804 to magnetically couple to the magnetic engagement feature (as described herein).

Figure 9:
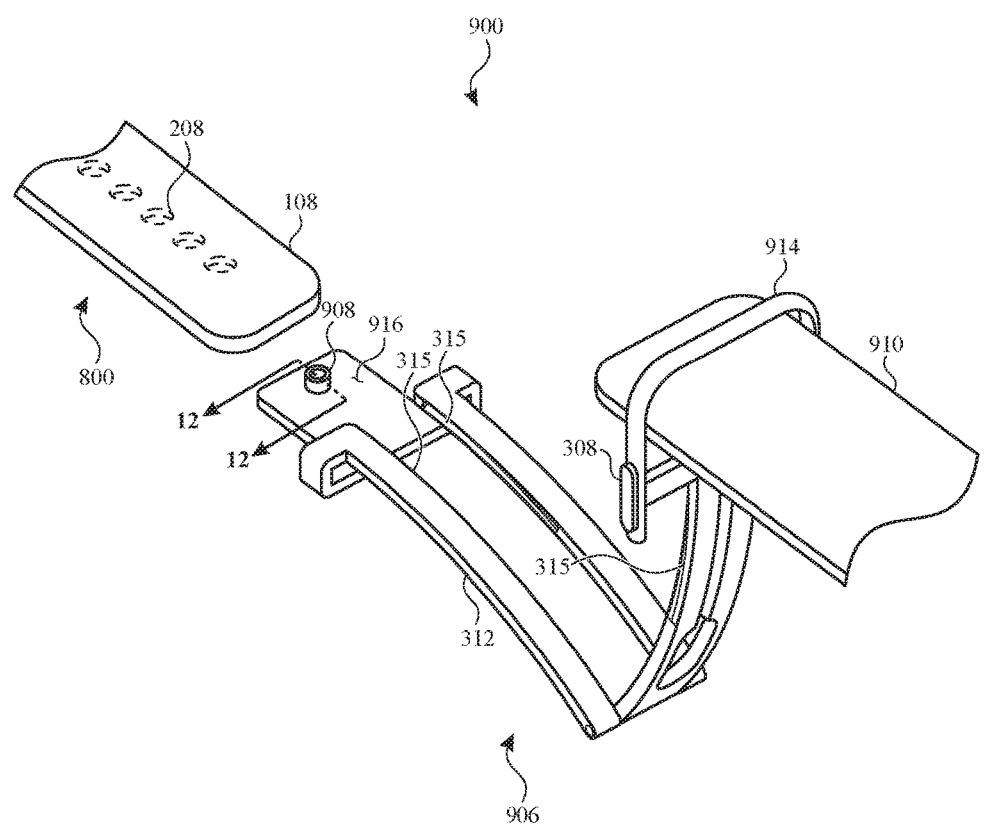
FIG. 9 shows a partial view of a band for a wearable device that includes the strap of FIG. 8.

FIG. 9 is a partial view of a band 900, showing the first strap 800 and a second strap 910 coupled to a strap connection portion 914. The second strap 910 may be made of the same or similar materials as the first strap 800, and is coupled to a clasp 906. FIG. 9 shows the first and second straps 800, 910 in an uncoupled configuration with the clasp 906 in an open configuration.

The clasp 906 is substantially similar to the clasp 110, but instead of the magnetic protrusion 302, the clasp 906 includes a magnetic engagement feature 908 extending from a surface 916 of the clasp 906. The magnetic engagement feature 908 is configured to be disposed in a respective one of the holes 802 and to magnetically couple to the ferromagnetic insert 804 disposed in the respective hole 802. As shown, the clasp 906 includes one magnetic engagement feature 908, but more may be used. The magnetic engagement feature 908 is also configured to mechanically retain the second strap 910 to the first strap 800 in a manner similar to that described herein with respect to the magnetic protrusion 302.

Figure 10:
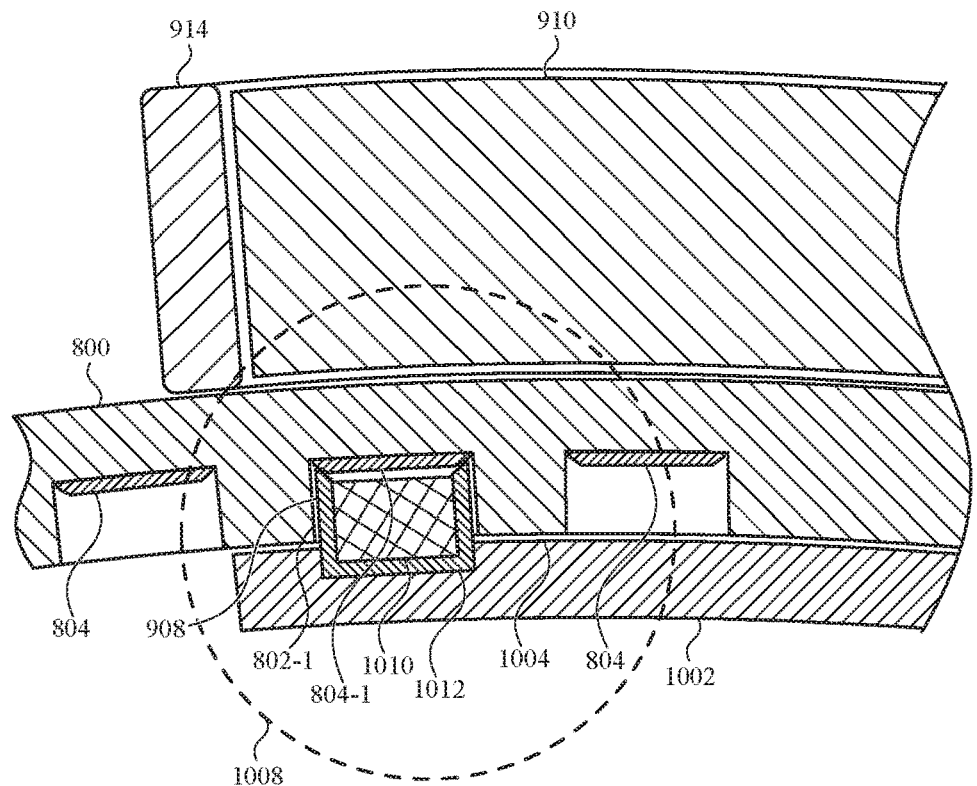
FIG. 10 shows a cross-sectional view of the band of FIG. 9 viewed along a line analogous to line 5-5 in FIG. 4.

FIG. 10 is a partial cross-sectional view of the band 900, taken through a line corresponding to line 5-5 in FIG. 4. (While FIG. 4 depicts a different embodiment than FIG. 10, the line 5-5 in FIG. 4 is merely used to indicate the location of the cross-sectional view of the band 900 that is shown in FIG. 10.) As shown in FIG. 10, the magnetic engagement feature 908, which is coupled to a base portion 1002 of the clasp 906, is disposed in a hole 802-1. The magnetic engagement feature 908 extends into the hole 802-1, thereby mechanically retaining the first strap 800 to the second strap 910. Moreover, the magnetic engagement feature 908 is magnetically attracted to a ferromagnetic insert 804-1 disposed in the hole 802-1, which retains the first and second straps 800, 910 together and also provides a positive tactile feedback to a user indicating that the magnetic engagement feature 908 has positively engaged the first strap 800. Apart from the differences between the magnetic engagement feature 908 and the magnetic protrusion 302, the clasp 906 operates similar to the clasp 110 (described with respect to FIGS. 3-5). For example, the clasp 906 captures (and may compress) the first strap 800 between a surface 1004 of the base portion 1002 and the strap connection portion 914 such that the magnetic engagement feature 908 is retained in the hole 802-1.

The magnetic engagement feature 908 comprises a magnet 1010 and an encasing structure 1012. The magnet 1010 may be formed from or include any appropriate material, such as neodymium iron boron, samarium cobalt, alnico, ceramic, or the like. The magnet 1010 may be a single magnet, or may include multiple magnets. The encasing structure 1012 surrounds at least part of the magnet 1010. In the embodiment shown in FIGS. 9-11, the magnet 1010 is a cylinder, and the encasing structure 1012 surrounds the magnet 1010 around the circumference of the cylinder and along the bottom of the magnet 1010. The encasing structure 1012 may be open along a top portion, thus exposing the magnet 1010 to the ferromagnetic insert 804-1. The encasing structure 1012 may be formed from any appropriate material, such as a magnetic stainless steel (e.g., martensitic and/or ferritic stainless steel), a non-magnetic stainless steel (e.g., austenitic stainless steel), or the like.

The encasing structure 1012 may be configured to direct or concentrate the magnetic field produced by the magnet 1010. For example, by surrounding the magnet 1010 with a non-magnetic stainless steel, the magnetic field produced by the magnet 1010 may be concentrated nearer to the magnet 1010 than would be the case if no encasing structure 1012 were used (or, for example, if a plastic or other non-metal material were used for the encasing structure 1012). Additionally, the encasing structure 1012 may be configured and/or shaped to prevent the magnet 1010 from contacting the ferromagnetic insert 804 when the magnetic engagement feature 908 is disposed in the hole 802. For example, as shown and described with respect to FIGS. 12A-12I, the magnet 1010 may be recessed from a top of the encasing structure 1012, and the ferromagnetic insert 804 may have a size and/or shape that engages the top portion of the encasing structure 1012 such that direct contact between the magnet 1010 and the ferromagnetic insert 804 is prevented. This configuration may help prevent the magnet 1010 from being damaged by impacts with the ferromagnetic insert 804. In particular, the magnetic attraction between the magnet 1010 and the ferromagnetic insert 804 may be sufficiently high that if they were allowed to couple directly to one another, the force of the impact could crack or break either or both of the components. Thus, the encasing structure 1012 separates the magnet 1010 from the ferromagnetic insert 804 via an air gap or an interstitial material/component.

Figure 11:
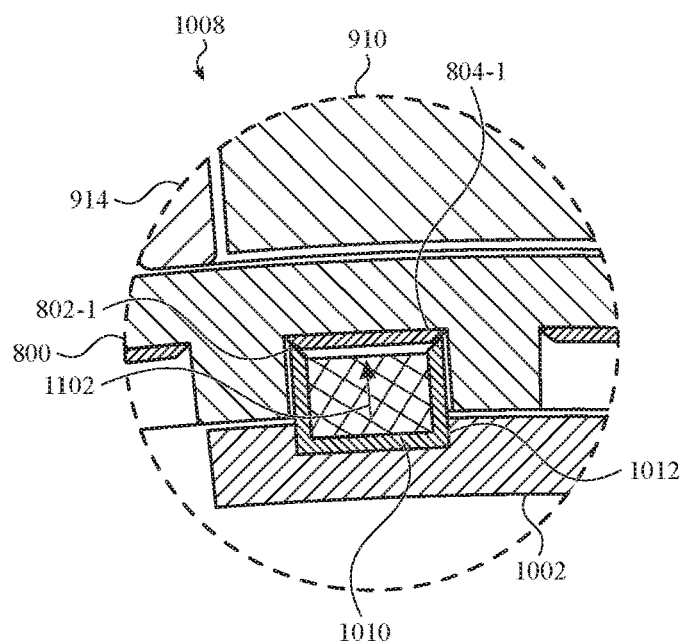
FIG. 11 shows a detail cross-sectional view of a portion of the band of FIG. 10.

FIG. 11 is a detail view of the area 1008 in FIG. 10, showing the magnetic engagement feature 908 disposed in the hole 802-1. The magnetic pole orientation of the magnet 1010 (when the magnetic engagement feature 908 is disposed in the hole 802-1) is substantially perpendicular to a longitudinal axis 806 (FIG. 8) of the first strap 800 and substantially perpendicular to a plane defined by a coupling face of the ferromagnetic insert 804-1, as represented by arrow 1102. The arrow 1102 may also correspond to a magnetic flux field line of the magnetic field produced by the magnet 1010.

When the magnetic engagement feature 908 is brought into proximity of the hole 802-1, the magnetic engagement feature 908 is subject to a magnetic attraction that tends to draw the magnetic engagement feature 908 into the hole 802-1 of first strap 800. Unlike the magnetic circuit described with respect to FIG. 6 where the magnetic flux through the magnetic insert 202 and the magnetic protrusion 302 is substantially parallel with the longitudinal axis 212 of the first strap 108, the magnetic flux through the magnetic circuit formed by the ferromagnetic insert 804-1 and the magnetic engagement feature 908 is substantially perpendicular to the longitudinal axis 806 of the first strap 800. Stated another way, the ferromagnetic insert 804-1 is attracted to the magnetic engagement feature 908 along a direction substantially parallel to or in line with an insertion direction of the magnetic engagement feature 908.

FIGS. 12A-12I illustrate cross-sections of various embodiments of the magnetic engagement feature 908 and the ferromagnetic insert or plate 804-1 (which together may be referred to as a magnetic coupling mechanism), taken through line 12-12 in FIG. 9. As noted above, maintaining a physical separation between the magnet 1010 and the ferromagnetic insert 804-1 may prevent the magnet 1010 from being damaged by impacts with the ferromagnetic insert 804-1. Accordingly, each of the embodiments shown in FIGS. 12A-12I includes either air gaps or an interstitial material between the magnet and the ferromagnetic insert. Moreover, each embodiment shown in FIGS. 12A-12I includes a ferromagnetic insert or plate, a magnet, and an encasing structure, which are similar in function to the ferromagnetic insert/plate 804-1, magnet 1010, and encasing structure 1012, respectively, described with respect to FIGS. 8-11. Structural differences between these components are discussed herein and/or shown in the figures.

FIG. 12A illustrates the magnetic coupling mechanism shown in FIGS. 9-11. The magnet 1010 is disposed within the encasing structure 1012, and a top portion of the encasing structure 1012 engages with the ferromagnetic insert 804-1 such that an air gap 1201 remains between the magnet 1010 and the ferromagnetic insert 804-1 when the magnet 1010 and the ferromagnetic insert 804-1 are magnetically coupled. In particular, the rim around the opening of the encasing structure 1012 is angled (e.g., forming a convex surface) to correspond to the angled outer edge of the ferromagnetic insert 804-1. When the ferromagnetic insert 804-1 is in contact with the rim of the encasing structure 1012, the ferromagnetic insert 804-1 is set apart from the magnet 1010 by a gap. The encasing structure 1012 may be formed from or include a magnetic stainless steel, or any other appropriate material. An arrow 1200 illustrates the magnetic pole orientation of the magnet 1010 (e.g., the north and south poles of the magnet 1010 may be oriented along a vertical line with respect to the orientation shown in FIG. 12A).

FIG. 12B illustrates an embodiment of a magnetic coupling mechanism that includes a ferromagnetic plate 1202, a magnet 1208 (with an arrow 1210 indicating the magnetic pole orientation of the magnet 1208), and an encasing structure that includes a base structure 1206 and a cap 1204 over a top portion of the base structure 1206 (and defining at least part of a top surface of the encasing structure). The base structure 1206 is formed from or includes a magnetic stainless steel (or any other appropriate material), and the cap 1204 is formed from or includes a non-magnetic stainless steel. The selection of the materials for the base structure 1206 and the cap 1204 (and indeed any of the components of the encasing structure in this or any other embodiments) may be based at least in part on a desired shape and/or concentration of the magnetic field produced by the magnet 1208 together with the encasing structure.

The base structure 1206 has a convex surface that engages (e.g., conforms to) a concave surface of the ferromagnetic plate 1202. Thus, the ferromagnetic plate 1202 forms a continuous contact surface with a top portion of the encasing structure (e.g., the cap 1204 and the edges of the base structure 1206). However, the magnet 1208 is separated from the cap 1204 by an air gap 1203. The presence (and/or the size) of the air gap 1203 may be determined based on a desired strength of the magnetic attraction between the magnet 1208 and the ferromagnetic plate 1202.

FIG. 12C illustrates an embodiment of a magnetic coupling mechanism that includes a ferromagnetic plate 1212, a magnet 1218 (with an arrow 1220 indicating the magnetic pole orientation of the magnet 1218), and an encasing structure that includes a base structure 1216 and a cap 1214 over a top of the base structure 1216 (and defining a top of the encasing structure). The base structure 1216 is formed from or includes a magnetic stainless steel (or any other appropriate material), and the cap 1214 is formed from or includes a non-magnetic stainless steel. The selection of the materials for the base structure 1216 and the cap 1214 may be based at least in part on a desired shape and/or concentration of the magnetic field produced by the magnet 1218 together with the encasing structure.

The cap 1214 has a convex surface that engages (e.g., conforms to) a concave surface of the ferromagnetic plate 1212. Thus, the ferromagnetic plate 1212 forms a continuous contact surface with a top portion or surface of the cap 1214. However, the magnet 1218 is separated from the cap 1214 by an air gap 1215. The presence (and/or the size) of the air gap 1215 may be determined based on a desired strength of the magnetic attraction between the magnet 1218 and the ferromagnetic plate 1212.

FIG. 12D illustrates an embodiment of a magnetic coupling mechanism that includes a ferromagnetic plate 1222, a first magnet 1228, a second magnet 1230, and an encasing structure that includes a base structure 1226 and a cap 1224 over a top of the base structure 1226 (and defining a top of the encasing structure). The base structure 1226 is formed from or includes a magnetic stainless steel (or any other appropriate material), and the cap 1224 is formed from or includes a non-magnetic stainless steel. The selection of the materials for the base structure 1226 and the cap 1224 may be based at least in part on a desired shape and/or concentration of the magnetic field produced by the magnets 1228, 1230 together with the encasing structure. While the cap 1224 has curved outer edges, the ferromagnetic plate 1222 has a substantially rectangular cross-section, and a substantially planar portion of the ferromagnetic plate 1222 contacts a substantially planar top portion of the cap 1224.

The first magnet 1228 and the second magnet 1230 have magnetic pole orientations that are parallel to one another but face in opposite directions, as illustrated by arrows 1234, 1232, respectively. By using two magnets with the illustrated magnetic pole orientations, the magnetic fields produced by the first and second magnets 1228, 1230 can be directed or concentrated as desired. For example, the magnetic field produced by the first magnet 1228 may be drawn towards the second magnet 1230, and vice versa, producing a more concentrated magnetic field in the vicinity of the first and second magnets than would be achieved with a single magnet of the same material.

FIG. 12E illustrates an embodiment of a magnetic coupling mechanism that includes a ferromagnetic plate 1236, a magnet 1242 (with an arrow 1248 indicating the magnetic pole orientation of the magnet 1242), and an encasing structure that includes a base structure 1246, a sidewall structure 1240, and a cap 1238 over a top of the base structure 1246 (and defining at least part of a top surface of the encasing structure). The base structure 1246 and the sidewall structure 1240 are formed from or include a magnetic stainless steel (or any other appropriate material), and the cap 1238 is formed from or includes a non-magnetic stainless steel. The selection of the materials for the base structure 1246, the sidewall structure 1240, and the cap 1238 may be based at least in part on a desired shape and/or concentration of the magnetic field produced by the magnet 1242 together with the encasing structure.

The sidewall structure 1240 and the cap 1238 together form a convex surface that engages (e.g., conforms to) a concave surface of the ferromagnetic plate 1236. Thus, the ferromagnetic plate 1236 forms a continuous contact surface with the top surface of the cap 1238 and a portion of the sidewall structure 1240.

FIG. 12F illustrates an embodiment of a magnetic coupling mechanism that includes a ferromagnetic plate 1250, a magnet 1256 (with an arrow 1260 indicating the magnetic pole orientation of the magnet 1256), and an encasing structure that includes a base structure 1258 and a cap 1254 over a top of the base structure 1258 (and defining a top surface of the encasing structure). The base structure 1258 is formed from or includes a magnetic stainless steel (or any other appropriate material), and the cap 1254 is formed from or includes a non-magnetic stainless steel. The cap 1254 has a convex surface that engages (e.g., conforms to) a concave surface of the ferromagnetic plate 1250. Thus, the ferromagnetic plate 1250 forms a continuous contact surface with a top portion or surface of the cap 1254.

The selection of the materials for the base structure 1258 and the cap 1254 may be based at least in part on a desired shape and/or concentration of the magnetic field produced by the magnet 1256 together with the encasing structure. For example, the embodiment of FIG. 12F has a similar geometry to the embodiment of FIG. 12E, but a greater amount of the encasing structure in FIG. 12F is formed from non-magnetic stainless steel as compared to FIG. 12E. This may produce a different shape and/or concentration of the magnetic field produced by the magnet 1256, and thus produce a different magnetic attraction with the ferromagnetic plate 1250 than would be achieved with the embodiment of FIG. 12E.

FIGS. 12G-12I illustrate embodiments of a magnetic coupling mechanism that include a magnet 1266 (with an arrow 1270 indicating the magnetic pole orientation of the magnet 1266), and an encasing structure that includes a base structure 1268 and a cap 1264 over a top of the base structure 1268 (and defining a top surface of the encasing structure). The base structure 1268 is formed from or includes a magnetic stainless steel (or any other appropriate material), and the cap 1264 is formed from or includes a non-magnetic stainless steel. The cap 1264 has a convex surface, a top portion or surface of which engages (e.g., conforms to) a portion of a ferromagnetic plate.

FIGS. 12G-12I each illustrate a cap having a different shape. FIG. 12G includes a ferromagnetic plate 1262 that has a concave surface that is configured to engage (e.g., conform to) a top portion or surface of the cap 1264, and a convex surface opposite the concave surface. FIG. 12H includes a ferromagnetic plate 1272 that has a substantially planar surface that is configured to engage with a top portion or surface of the cap 1264, and a convex surface opposite the concave surface. FIG. 12I includes a ferromagnetic plate 1274 that has a substantially rectangular cross-section, thus defining substantially planar surfaces on both a top and bottom of the ferromagnetic plate 1274 (with respect to the orientation shown in FIG. 12I). The shapes of the ferromagnetic plates in FIGS. 12G-12I (and indeed any of the ferromagnetic inserts described herein) may be selected based on any appropriate criteria, such as the strength of the magnetic attraction to a magnetic coupling mechanism, mechanical engagement with a magnetic coupling mechanism and/or a strap, or the like.

Figure 13:
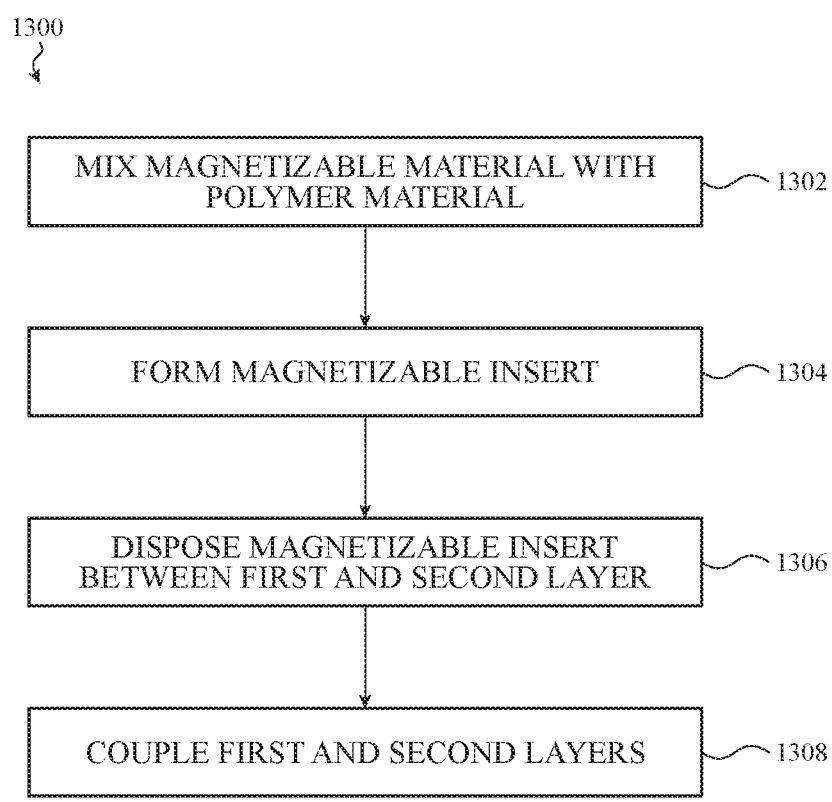
FIG. 13 shows an example process for manufacturing a strap.

FIG. 13 illustrates a process 1300 of manufacturing a magnetic strap for a wearable device. The process 1300 may be used to manufacture a strap such as the first strap 108 of the band 104, described above, though the process 1300 may be used to form other straps as well. As shown and described, the process 1300 includes several steps. It will be understood that the process 1300 may include more or fewer steps than those described, and the steps may be reordered, combined, and/or omitted. Moreover, the process 1300 is not an exhaustive list of all possible techniques or methods that may be used to manufacture the straps that are described herein. On the contrary, the straps (e.g., the first strap 108) may be manufactured or produced in any appropriate way.

At operation 1302, a magnetizable material is mixed with a polymer material to form a moldable mixture that is used to form a magnetizable insert (e.g., a precursor to the magnetic insert 202, FIG. 2). The magnetizable material (e.g., particles of neodymium iron boron, samarium cobalt, alnico, ceramic, or the like) may be mixed with any appropriate polymer material (e.g., nylon, polyurethane, silicone, or the like) in any appropriate way. For example, the magnetizable material may be mixed with a solid polymer feedstock prior to melting and/or molding of the polymer material. As another example, the magnetizable material may be added to a liquid (e.g., molten or uncured) polymer material.

At operation 1304, a magnetizable insert in which the magnetizable material is suspended in the polymer material is formed. The magnetizable insert may be formed, for example, by introducing the moldable mixture into a mold cavity, and then allowing the moldable mixture to cure (e.g., to cool and/or chemically cure). The magnetizable material may be uniformly distributed throughout the polymer material, or it may be concentrated in certain areas. For example, the magnetizable material may be more densely distributed near the holes 210 in the flexible magnetic insert 202 in FIG. 2, and less densely distributed in areas away from the holes 210. Thus, the strength, location, and/or shape of the magnetic field(s) produced by the magnetizable material may be tailored to achieve desired results.

After the magnetizable insert is molded, an encapsulating material may be applied to the magnetizable insert. The encapsulating material may be any appropriate material (e.g., silicone, polyurethane, nylon, paint, epoxy, or the like), and may be applied to the material in any appropriate way. For example, the encapsulating material may be sprayed, brushed, dip-coated, or overmolded onto the magnetizable insert. The encapsulating material may be applied to the entire insert, or it may be applied to selective portions of the insert (e.g., sidewalls and/or edges of holes formed in the insert).

Holes (e.g., holes 210, FIG. 2) may be formed in the magnetizable insert during or after molding. For example, the mold cavity used to mold the insert may include features that form the holes in the insert during molding, such that the holes are included in the as-molded part. As another example, holes may be formed in the insert after it is molded, for example by drilling, punching, or cutting (e.g., with a laser, water jet, blade, or the like). Where the holes are formed after the insert is molded, an encapsulating or sealing material may be applied to the insert after the holes are formed. In particular, the process of forming the holes in the insert may expose portions of the magnetizable material, resulting in abrasive surfaces and/or edges, and the encapsulating or sealing material may cover such surfaces to prevent abrasion and/or damage to other components.

The magnetizable insert may then be magnetized, for example, by exposing the magnetizable insert to a magnetic field (e.g., with an electromagnet). The magnetizable insert may be magnetized such that a magnetic pole orientation of the magnetizable insert is substantially parallel to a longitudinal axis of a strap in which the magnetizable insert is to be incorporated. For example, a line extending from a north pole to a south pole of the magnetizable insert is substantially parallel with a longitudinal axis of a strap (e.g., the longitudinal axis 212). The magnetizable insert may be magnetized before the magnetizable insert is incorporated into a strap (e.g., before operations 1306, 1308, below), or after it is incorporated into a strap (e.g., after operations 1306, 1308).

At operation 1306, the magnetizable insert is disposed between a first layer and a second layer. The first and second layers may be formed from or include any appropriate material, such as leather, fabric, polymer (e.g., Vectran, Kevlar, silicone, nylon, or polyurethane). One or both of the first and second layers may include a recess or opening into which the magnetizable insert may be completely or partially disposed. For example, as shown in FIG. 2, a magnetizable insert (e.g., the magnetic insert 202) may be disposed in a recess (e.g., the recess 206) of a layer of material.

At operation 1308, the first layer is coupled to the second layer such that the magnetizable insert is retained between the first layer and the second layer. The first layer may be coupled to the second layer in any appropriate manner, such as stitching, gluing, overmolding, spraying, welding (e.g., ultrasonic welding), or the like.

Holes may be formed in the second layer, which communicate with the holes in the magnetizable insert to form the holes into which a magnetic protrusion (or magnetic coupling mechanism) may extend. The holes in the second layer may be formed before the second layer is coupled to the first layer. For example, in some cases, the holes are formed in the second layer by drilling, punching, or cutting (e.g., with a laser, water jet, blade, or the like), and then the second layer is aligned with the magnetizable insert (which also has holes formed therein) so that the holes of the second layer and the magnetizable insert align. The aligned second layer and magnetizable layer are then coupled to the first layer to form the strap. The holes in the second strap and the magnetizable insert may be formed at the same time. For example, a magnetizable insert may be coupled to the second strap, and holes may be formed in both the second strap and the magnetizable insert by drilling, punching, or cutting (e.g., with a laser, water jet, blade, or the like). This ensures that the holes in the second strap and the holes in the magnetizable insert are properly aligned. The assembly including the second strap and the magnetizable insert may then be coupled to the first layer to form the strap. In some cases, holes are formed through the whole strap, including through the second layer, the magnetizable insert, and the first layer. In such cases, the holes may be formed (for example by drilling, punching, or cutting) after operation 1308.

In some cases, instead of forming holes that extend through an entire thickness of the second layer, portions of the second layer are debossed (e.g., pressed) into the holes in the magnetizable layer that is disposed below the second layer. For example, the second layer may be coupled to the magnetizable layer, as part of or prior to operation 1308, and a tool may be pressed onto the second layer over the holes in the magnetizable layer to force portions of the second layer into the holes. The tool may be heated to facilitate deformation of the material of the second layer. The material of the second layer may remain intact within the holes of the magnetic material, thus forming a cover over the surfaces defining the hole. This may help to cover abrasive portions of the magnetic insert and to prevent wear, damage, or delamination of the strap in the vicinity of the holes. Additionally, this may allow the strap to appear to be formed from a single material, even though it may be formed from multiple layers and components.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A band for a wearable device, comprising:
   a first strap comprising a magnetic insert defining an array of holes; and a second strap;
a clasp comprising a first clasp portion pivotally coupled to a second clasp portion, the first clasp portion being coupled to the second strap; and
a magnetic protrusion extending from a surface of the second clasp portion and being configured to be at least partially disposed in a respective hole of the array of holes and to magnetically couple to the magnetic insert;
wherein, when the clasp is in a closed configuration, the first strap is captured between the first clasp portion and the second clasp portion such that the magnetic protrusion is retained at least partially in the respective hole.

2. The band of claim 1, wherein the first strap further comprises:
a first layer defining a first exterior surface; and
a second layer defining a second exterior surface opposite the first exterior surface; wherein
the magnetic insert is between the first layer and the second layer.

3. The band of claim 1, wherein the clasp comprises latching features that releasably retain the clasp in the closed configuration.

4. The band of claim 1, wherein:
the magnetic insert comprises a polymer material having magnetized particles suspended therein; and
the magnetic protrusion comprises a permanent magnet.

5. The band of claim 1, wherein:
the first strap extends along a longitudinal axis; and
the magnetic insert has a magnetic pole orientation that is substantially parallel to the longitudinal axis.

6. The band of claim 1, wherein:
the first clasp portion comprises first arms with first latching features; and
the second clasp portion comprises second arms with second latching features, wherein, when the clasp is in the closed configuration, the first latching features engage the second latching features.

7. The band of claim 6, wherein the first clasp portion comprises buttons that, when operated, cause the first latching features to disengage the second latching features.

8. The band of claim 1, wherein a magnetic pole orientation of the magnetic insert faces a same direction as a magnetic pole orientation of the magnetic protrusion.

9. A band for a wearable device, comprising:
a first strap comprising a magnetic insert; and
a second strap;
a clasp coupled to the second strap and comprising:
a first clasp portion having first arms with first latching features; and
a second clasp portion having second arms with second latching features, the second clasp portion being pivotally coupled to the first clasp portion; and
a magnetic protrusion positioned at the second clasp portion and being configured to magnetically couple to the magnetic insert;
wherein, when the clasp is in a closed configuration, the first latching features engage the second latching features and the first strap is captured between the first clasp portion and the second clasp portion.

10. The band of claim 9, wherein:
the first clasp portion comprises first arms with first latching features; and
the second clasp portion comprises second arms with second latching features, wherein, when the clasp is in the closed configuration, the first latching features engage the second latching features.

11. The band of claim 10, wherein the first clasp portion comprises buttons that, when operated, cause the first latching features to disengage the second latching features.

12. The band of claim 9, wherein a magnetic pole orientation of the magnetic insert faces a same direction as a magnetic pole orientation of the magnetic protrusion.

13. The band of claim 9, wherein the first strap comprises:
a first layer defining a first exterior surface;
a second layer defining a second exterior surface opposite the first exterior surface; and
the magnetic insert between the first layer and the second layer, wherein the second layer and the magnetic insert define holes extending entirely through the second layer and the magnetic insert and to the first layer.

14. The band of claim 9, wherein:
the magnetic insert comprises a polymer material having magnetized particles suspended therein; and
the magnetic protrusion comprises a permanent magnet.

15. A band for a wearable device, comprising:
a first strap comprising:
a first layer defining a first exterior surface;
a second layer defining a second exterior surface opposite the first exterior surface; and
a magnetic insert between the first layer and the second layer, wherein the second layer and the magnetic insert define an array of holes extending entirely through the second layer and the magnetic insert and to the first layer; and
a second strap comprising a magnetic protrusion configured to be at least partially disposed in a respective hole of the array of holes and to magnetically couple to the magnetic insert, wherein the magnetic insert and the magnetic protrusion each have a magnetic pole orientation that is substantially parallel to a longitudinal axis of the first strap; and
a clasp comprising:
a first clasp portion coupled to the second strap; and
a second clasp portion pivotally coupled to the first clasp portion, wherein, when the clasp is in a closed configuration, the first strap is captured between the first clasp portion and the second clasp portion.

16. The band of claim 15, wherein:
the first clasp portion comprises first arms with first latching features; and
the second clasp portion comprises second arms with second latching features, wherein, when the clasp is in the closed configuration, the first latching features engage the second latching features.

17. The band of claim 16, wherein the first clasp portion comprises buttons that, when operated, cause the first latching features to disengage the second latching features.

18. The band of claim 15, wherein the magnetic pole orientation of the magnetic insert faces a same direction as the magnetic pole orientation of the magnetic protrusion.

19. The band of claim 15, wherein:
the magnetic insert comprises a polymer material having magnetized particles suspended therein; and
the magnetic protrusion comprises a permanent magnet.

* * * * *